(12) United States Patent
Company Bosch et al.

(10) Patent No.: US 8,368,453 B2
(45) Date of Patent: Feb. 5, 2013

(54) SWITCH CIRCUITS

(75) Inventors: Enrique Company Bosch, Alginet (ES); John Anthony Cleary, Kilmallock (IE)

(73) Assignee: Analog Devices, Inc., Norwood, MA (US)

(*) Notice: Subject to any disclaimer, the term of this patent is extended or adjusted under 35 U.S.C. 154(b) by 67 days.

(21) Appl. No.: 13/115,703

(22) Filed: May 25, 2011

(65) Prior Publication Data

US 2012/0299637 A1    Nov. 29, 2012

(51) Int. Cl.
*H03K 17/687* (2006.01)

(52) U.S. Cl. ......... 327/427; 327/434; 327/436; 327/437

(58) Field of Classification Search ........... 327/365–566
See application file for complete search history.

(56) References Cited

U.S. PATENT DOCUMENTS

| | | | | |
|---|---|---|---|---|
| 4,544,854 | A | 10/1985 | Ulmer et al. | |
| 4,590,456 | A | 5/1986 | Burton et al. | |
| 6,159,443 | A * | 12/2000 | Hallahan | 424/1.17 |
| 6,163,199 | A * | 12/2000 | Miske et al. | 327/434 |
| 6,169,443 | B1 * | 1/2001 | Shigehara et al. | 327/534 |
| 6,492,860 | B1 | 12/2002 | Ramakrishnan | |
| 6,970,126 | B1 | 11/2005 | O'Dowd et al. | |
| 7,235,983 | B2 | 6/2007 | O'Dowd et al. | |
| 7,304,483 | B2 | 12/2007 | O'Dowd et al. | |
| 7,385,439 | B2 | 6/2008 | Makino et al. | |
| 7,514,983 | B2 * | 4/2009 | Miske | 327/534 |
| 7,554,382 | B2 * | 6/2009 | Miske et al. | 327/382 |
| 7,636,004 | B2 * | 12/2009 | Nakatsuka et al. | 327/308 |
| 7,728,649 | B1 * | 6/2010 | Webb et al. | 327/534 |
| 7,834,677 | B2 * | 11/2010 | Yu | 327/391 |
| 7,924,085 | B2 * | 4/2011 | Guo | 327/534 |
| 8,212,604 | B2 * | 7/2012 | Dianbo | 327/389 |
| 2003/0227311 | A1 | 12/2003 | Ranganathan | |
| 2006/0208787 | A1 * | 9/2006 | Callahan | 327/404 |
| 2007/0194832 | A1 * | 8/2007 | Miske et al. | 327/427 |
| 2007/0285149 | A1 | 12/2007 | Nakatani et al. | |
| 2009/0153198 | A1 | 6/2009 | Augustyniak et al. | |

OTHER PUBLICATIONS

Ishida et al., "Managing Leakage in Charge-Based Analog Circuits with Low-VTH Transistors by Analog T-Switch (AT-Switch) and Super Cut-off CMOS", 2005 Symposium on VLSI Circuits, Digest of Technical Papers, Jun. 16-18, 2005, pp. 122-125.

* cited by examiner

*Primary Examiner* — Lincoln Donovan
*Assistant Examiner* — Brandon S Cole
(74) *Attorney, Agent, or Firm* — Kenyon & Kenyon LLP

(57) ABSTRACT

A switch can be implemented by a switch circuit, which can include a pair of NMOS transistors connected in series as pass-through transistors to transmit an input signal at an input terminal to produce an output signal at output terminal in response to an active state of a switching signal, and a pair of PMOS transistors connected in series as pass-through transistors to transmit the input signal at the input terminal to produce the output signal at output terminal in response to the active state of the switching signal. The switch circuit can also include a switch network connecting, in response to the active state of the switching signal, sources to bodies of the pairs of NMOS and PMOS transistors, and connecting, in response to an inactive state of the switching signal, the bodies of the pair of NMOS transistors to a first reference voltage, the bodies of the pair of PMOS transistors to a second reference voltage, and the sources of the pairs of NMOS and PMOS transistors to a third reference voltage. A capacitance-to-voltage converter can include one or more of the switch circuits.

33 Claims, 5 Drawing Sheets

(On State)

(Off State)

SWITCH CIRCUITS

BACKGROUND

Switches can be used as building blocks in many different circuits. When turned on, a switch can generally connect an input to an output to allow a signal at the input to pass through to the output. When turned off, the switch can disconnect the input from the output to prevent the signal at the input from passing through to the output. Individual switches can be implemented by a variety of circuits, with one of the simplest including only single transistor. Two main characteristics of a switch are its on-resistance and its leakage current.

The on-resistance of a switch can be the resistance the switch presents in series between the input and output when the switch is turned on. It is often desirable that the on-resistance be as low as possible, and ideally be zero, so that the switch effectively presents a short circuit when it is turned on, directly connecting the input to the output with no resistance in between. It is also often desirable that any on-resistance be independent of the signal being transmitted by the switch, so that the switch does not introduce non-linear or other undesirable effects onto the transmitted signal. However, in reality, there is often a finite on-resistance presented by the circuit implementing the switch, and this on-resistance can vary based on the signal being transmitted by the switch.

The leakage current of a switch can be the amount of current that leaks between the input and output terminals when the switch is turned off. It is often desirable that leakage current be as low as possible, and ideally be zero, so that the switch effectively presents an open circuit when turned off, completely cutting off the input from the output with an infinite resistance in between. Another way of characterizing the leakage current is as an off-resistance of the switch. To achieve a zero leakage current, a switch circuit should have an infinite off-resistance. However, in reality, there is often a finite leakage current exhibited by the circuit implementing the switch.

The effect of non-ideal on-resistances and leakage currents can be seen in an exemplary circuit. FIG. 1 depicts an embodiment of a capacitance-to-voltage converter 20 that can include four switches 24, 28, 32, 36, an integrator including a differential amplifier A1 and a pair of capacitors CI1, CI2, and a sensing capacitor CS. In operation, two of the switches 24, 28 can charge the sensing capacitor CS to two different voltages. The capacitor charging time can be proportional to the on-resistance of these two switches 24, 28. The other two switches 32, 36 can connect the sensing capacitor CS to the inputs of the differential integrator. Leakage current in these other two switches 32, 36 may be integrated by the integrator, producing erroneous output voltages VOP, VON. The amplifier settling time may also depend on the on-resistance of these second two switches 32, 36, and the linearity of operation of the capacitance-to-voltage converter 20 may depend on any signal-dependent nature of these on-resistances.

The problems of a non-zero, signal-dependent on-resistance and a non-zero leakage current can be exacerbated by evolving fabrication processes used to manufacture transistors and switch circuits. Generally, a common trend in fabrication process evolution is for device sizes to scale downward in size, which can provide higher frequency operation and reduced power consumption. However, this scaling can also necessitate or result in reduced power supply and threshold voltages used with such transistors and circuits. Many performance measures of transistor-based circuits are dependent on the difference between the power supply and threshold voltages. For example, leakage currents of transistors can tend to increase when the threshold voltage decreases, but on-resistances of transistors can tend to decrease with decreasing threshold voltages. Thus, many transistor-based switch implementations face opposing performance impacts of device scaling.

A need exists, therefore, for a switch implementation that can exhibit both a low, signal-independent on-resistance when turned on and a low-leakage current when turned off, even in the face of fabrication process evolution in which device scaling may cause reduced power supply and threshold voltages.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

DETAILED DESCRIPTION

Figure 2:
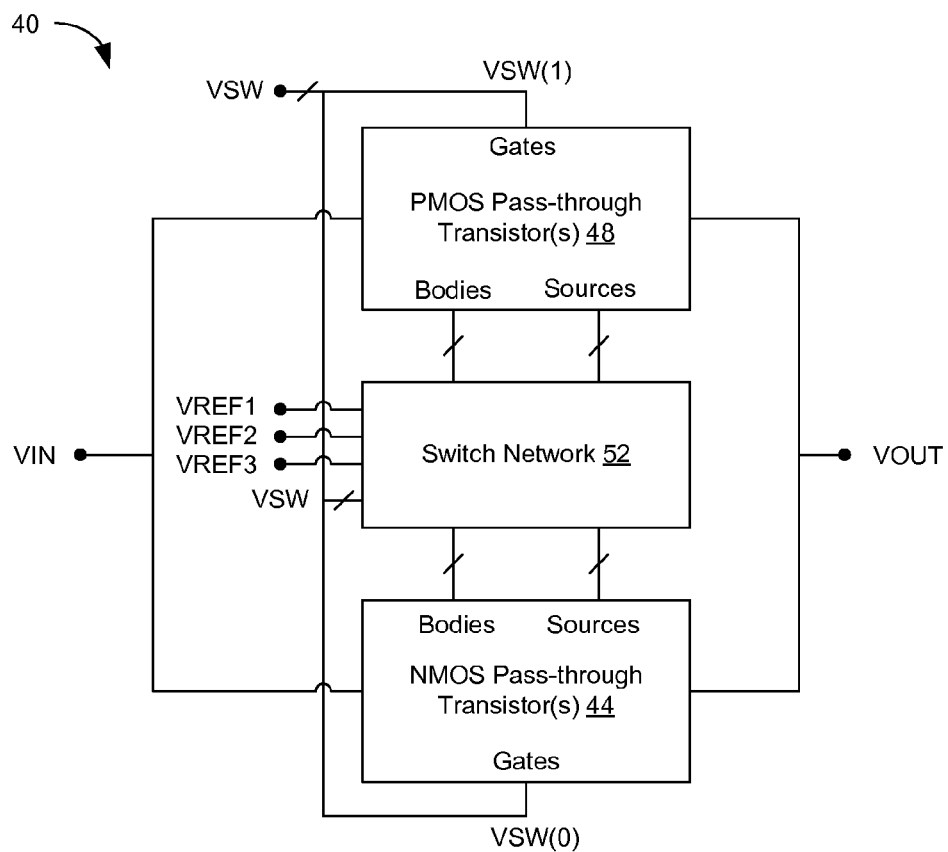
FIG. 2 is a circuit schematic depicting an embodiment of a switch circuit having NMOS and PMOS pass-through transistors and a switch network.

FIG. 2 depicts an embodiment of a circuit 40 that can be used to implement a switch. The switch circuit 40 can include a plurality of NMOS and PMOS pass-through transistors 44, 48. The pass-through transistors 44, 48 may receive an input signal VIN at an input terminal, allow the input signal VIN to pass through to produce an output signal VOUT at an output terminal in response to an active state of a switching signal VSW(0), and prevent the input signal VIN from passing through to the output terminal in response to an inactive state of the switching signal VSW(0). The switch circuit 40 can also include a switch network 52. The switch network 52 may selectively connect the source and body terminals of the pass-through transistors 44, 48 in response to the active and inactive states of the switching signal VSW(0) and other related switching signals. These selective connects can enable the switch circuit 40 to exhibit a lower, more signal-independent on-resistance when turned on, and a lower leakage current when turned off.

Specifically, in the on state of the switch circuit 40, the switch network 52 can connect together the sources and bodies of the NMOS and PMOS pass-through transistors 44, 48 to reduce the value and signal dependence of their on-resistances by reducing the source-to-body voltages and thus the threshold voltages of the pass-through transistors 44, 48. In the off state, the switch network 52 can connect the bodies of the NMOS transistors 44 to a first reference voltage VREF1, the bodies of the PMOS transistors 48 to a second reference voltage VREF2, and the sources of the NMOS and PMOS transistors 44, 48 to a third reference voltage VREF3 to enable the switch circuit 40 to reduce the leakage current by increasing the source-to-body voltages, and thus the threshold voltages, and reducing the drain-to-source voltages of the pass-through transistors 44, 48.

Figure 3:
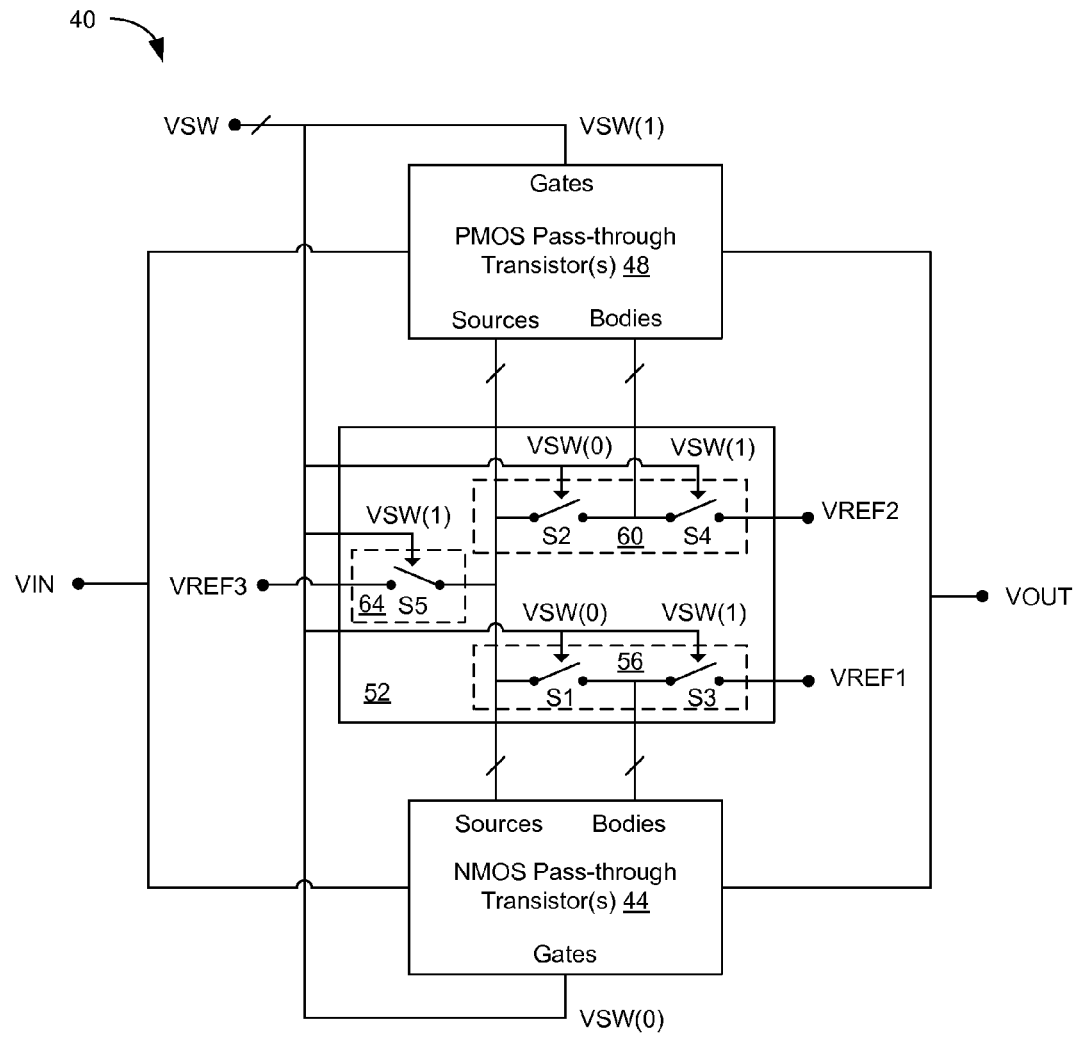
FIG. 3 is a circuit schematic depicting another embodiment of the switch circuit.

FIG. 3 depicts an exemplary embodiment of the switch circuit 40 of FIG. 2. As shown in FIG. 3, the switch network 52 of the switch circuit 40 can include a plurality of switch subnetworks 56, 60, 64 (also referred to herein as simply switch networks 56, 60, 64), each of which can implement some of the functions of the switch network 52. In FIG. 3, a switch subnetwork 56 can include a switch S1 that can be turned on to connect together, and to a common circuit node, sources and bodies of the NMOS pass-through transistors 44 in response to the active state (e.g., logical high state) of the main switching signal VSW(0). Similarly, a switch network 60 can include a switch S2 that can be turned on to connect together, and to the common circuit node, the sources and bodies of the PMOS pass-through transistors 48 in response to the active state of the switching signal VSW(0). During the active state of the switching signal VSW(0), other switches S3, S4, S5 of the switch subnetworks 56, 60, 64 can be turned off.

Connecting together the sources and bodies of the NMOS and PMOS pass-through transistors 44, 48 can reduce the value of the on-resistances the pass-through transistors 44, 48, and thus of the overall switch circuit 40, as well as the dependence of these on-resistances on the value of input signal VIN. The on-resistance of a transistor can depend on the threshold voltage of the transistor, with the lower the threshold voltage, the lower the on-resistance. The threshold voltage can in turn depend on the voltage difference across the source to the body of the transistor, with the lower this voltage difference, the lower the threshold voltage. By connecting together the sources and bodies of the pass-through transistors 44, 48, the voltage across the sources to the bodies can be reduced, and thus both the threshold voltage and on-resistance can be reduced. Furthermore, by connecting the bodies to the sources of the pass-through transistors 44, 48, the dependence of the threshold voltage and thus the on-resistance on the input signal VIN can be reduced because the voltage difference across the sources to the bodies may no longer be a function of the input signal VIN.

The operation of the switch network 52 in response to the inactive state of the switching signal VSW(0) can also be considered. The switch network 56 can include a switch S3 that can be turned on to connect the bodies of the NMOS pass-through transistors 44 to the first reference voltage VREF1 in response to the inactive state of the switching signal VSW(0), e.g., in response to the logical high state of the logical inverse of the switching signal VSW(1). Similarly, the switch network 60 can include a switch S4 that can be turned on to connect the bodies of the PMOS pass-through transistors 48 to the second reference voltage VREF2 in response to the inactive state of the switching signal VSW(0), e.g., in response to the logical high state of the inverse switching signal VSW(1)). The switch network 64 can include a switch S5 that can be turned on to connect the sources of the NMOS and PMOS pass-through transistors 44, 48 to the third reference voltage VREF3 during the inactive state of the switching signal VSW(0), e.g., during the logical high state of the inverse switching signal VSW(1).

Connecting the bodies of the NMOS and PMOS pass-through transistors 44, 48 to the first and second reference voltages VREF1, VREF2, respectively, and the sources of the pass-through transistors 44, 48 to the third reference voltage VREF3, can reduce the value of the leakage current of the pass-through transistors 44, 48, and thus of the overall switch circuit 40. The leakage current of a transistor can depend on the threshold voltage of the transistor, with the higher the threshold voltage, the lower the leakage current. As discussed above, the threshold voltage can in turn depend on the voltage difference across the source to body of the transistor, with the lower this voltage difference, the lower the threshold voltage. By connecting the bodies of the NMOS and PMOS pass-through transistors 44, 48 to the first and second reference voltages VREF1, VREF2, connecting the sources of these pass-through transistors 44, 48 to the third reference voltage VREF3, and selecting these first, second and third reference voltages VREF1, VREF2, VREF3 to maximize or increase the voltage across the sources to bodies of the pass-through transistors 44, 48, the threshold voltage can be increased and the leakage current reduced. In one example, the first and second reference voltages VREF1, VREF2 can be selected to have a value corresponding to the low and high supply voltages VSS, VDD of a circuit containing the switch circuit 40, respectively, and the third reference voltage VREF3 can be selected to have a value corresponding to an intermediate voltage between the low and high supply voltages VSS, VDD of the circuit, e.g., a value halfway between the low and high supply voltages VSS, VDD or a value at some selected percentage of the distance between the low and high supply voltages VSS, VDD (e.g., to accommodate different device characteristics of NMOS and PMOS transistors).

The leakage current of a transistor can also depend on the voltage difference across the drain to source of the transistor, with the lower this voltage difference, the lower the leakage current. Connecting the sources of the NMOS and PMOS pass-through transistors 44, 48 to the third reference voltage VREF3 can reduce the leakage current of one or more of these devices in the off state of the switch circuit 40 as the third reference voltage VREF3 can be chosen to have a value equal to or near in value to the value of voltages VIN, VOUT present at either the input or output terminal, or both. Choosing the third reference voltage VREF3 connected to the sources of the pass-through transistors 44, 48 to be close to the voltages VIN, VOUT present at the input or output terminals can reduce the voltage difference across the drain to source of one or more of these transistors 44, 48, thereby reducing its leakage current.

Figure 4:
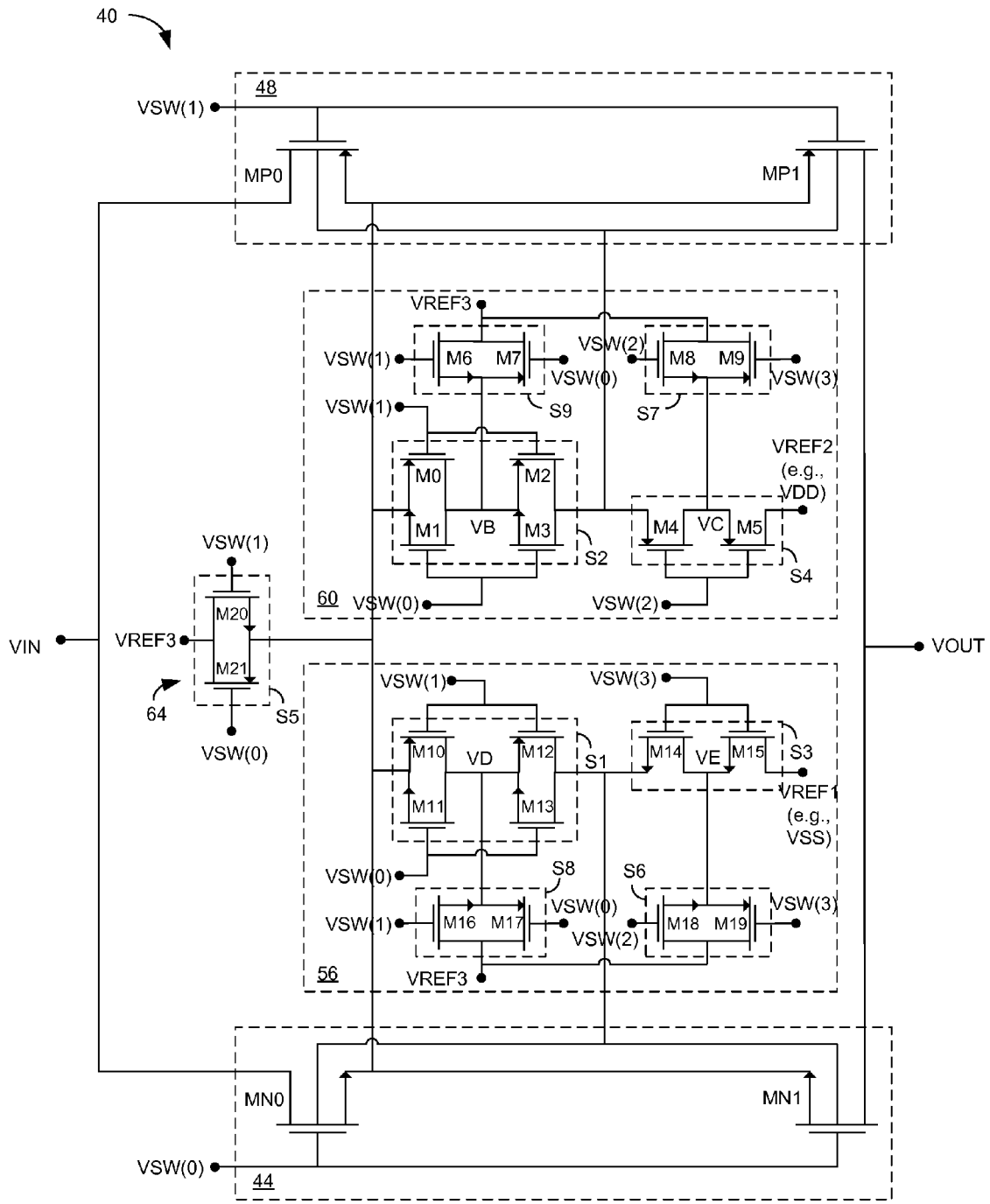
FIG. 4 is a circuit schematic depicting another embodiment of the switch circuit.
Figure 5:
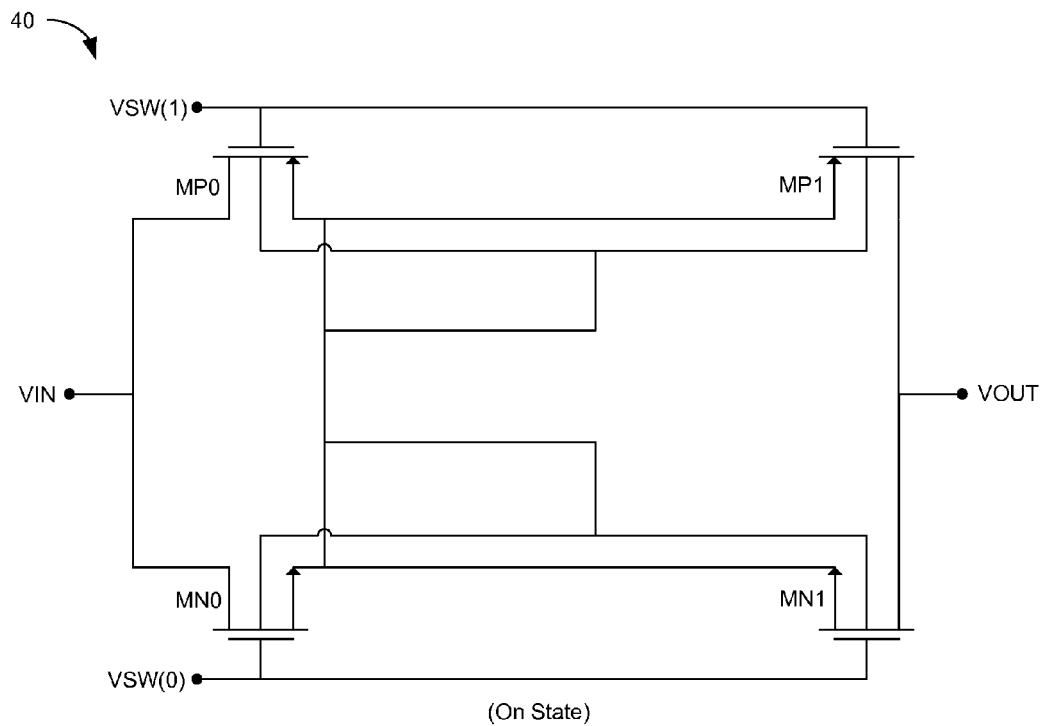
FIG. 5 is a circuit schematic depicting a representation of the switch circuit of FIG. 4 in an on state.
Figure 6:
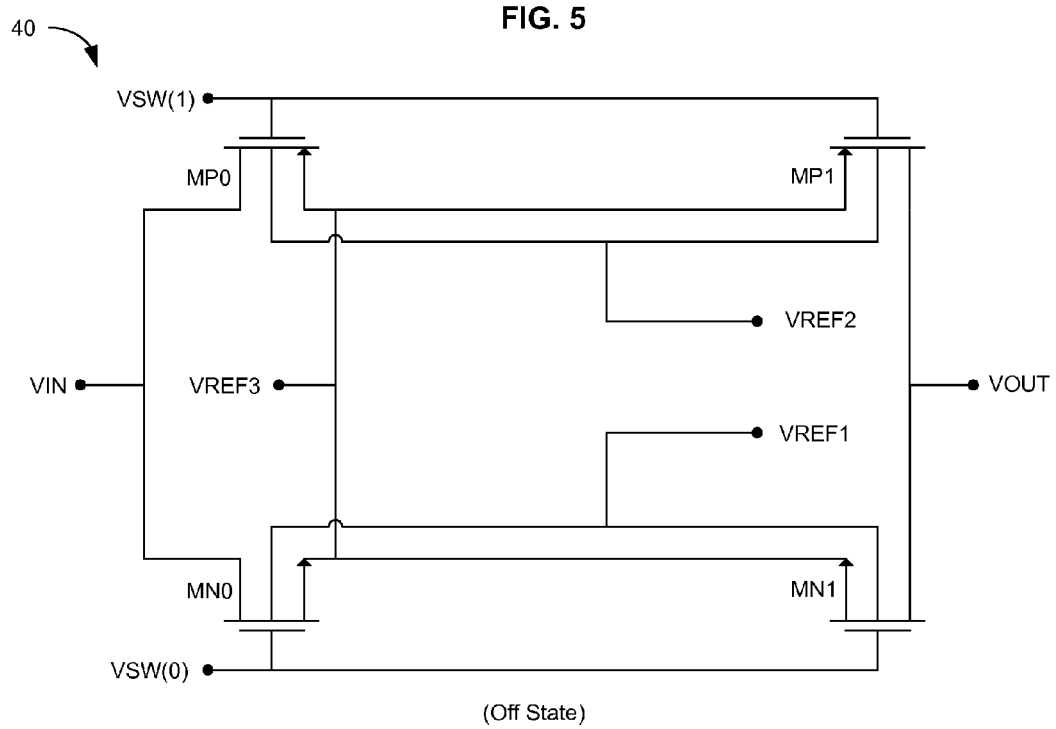
FIG. 6 is a circuit schematic depicting a representation of the switch circuit of FIG. 4 in an off state.

FIG. 4 depicts another exemplary embodiment of the switch circuit 40 of FIGS. 2 and 3, and FIGS. 5 and 6 depict representations of the embodiment of FIG. 4 when the switch circuit is in its on and off states, respectively, e.g., during the active an inactive states of the switching signal VSW(0), respectively. In FIG. 4, the NMOS pass-through transistors 44 can include a plurality of NMOS pass-through transistors 44, such as a pair of NMOS pass-through transistors 44 including a first NMOS pass-through transistor MN0 and a second NMOS pass-through transistor MN1. The first and second NMOS pass-through transistors MN0, MN1 can be connected in series between the input and output terminals of the switch circuit 40. Specifically, a drain of the first NMOS pass-through transistor MN0 can be connected to the input terminal, a source of the first NMOS pass-through transistor MN0 can be connected to a source of the second NMOS pass-through transistor MN1, and a drain of the second NMOS pass-through transistor MN1 can be connected to the output terminal. The gates of the first and second NMOS pass-through transistors MN0, MN1 can be connected together and receive the switching signal VSW(0) controlling the pass-through operation of the switch circuit 40. In a similar fashion, the PMOS pass-through transistors 48 can a plurality of PMOS pass-through transistors 48, such as a pair of PMOS pass-through transistors 48 including a first PMOS pass-through transistor MP0 and a second PMOS pass-through transistor MP1. The first and second PMOS pass-through transistors MP0, MP1 can be connected in series between the input and output terminals of the switch circuit 40. Specifically, a drain of the first PMOS pass-through transistor MP0 can be connected to the input terminal, a source of the first PMOS pass-through transistor MP0 can be connected to a source of the second PMOS pass-through transistor MP1, and a drain of the second PMOS pass-through transistor MP1 can be connected to the output terminal. The gates of the first and second PMOS transistors MP0, MP1 can be connected together and receive a logical inverse of the switching signal VSW(1) controlling the pass-through operation of the switch circuit 40.

In FIG. 4, the switch S1 of the switch subnetwork 56 can include a plurality of transistor pairs, including a transistor pair having an NMOS transistor M11 and a PMOS transistor M10, and another transistor pair having an NMOS transistors M13 and a PMOS transistor M12. Each of these transistor pairs can operate as a separate switch, and thus the switch S1 of the switch subnetwork 56 can be implemented by two switches in series in FIG. 4. The NMOS transistors M11, M13 of the transistor pairs can have their gates connected together and to the switching signal VSW(1), and the PMOS transistors M10, M12 of the transistor pairs can have their gates connected together and to the logical inverse of the switching signal VSW(1). The switch S3 of the switch network 56 can include a plurality of transistors, including NMOS transistors M14 and M15. Each of these NMOS transistors M14, M15 can operate as a separate switch, and thus the switch S3 of the switch subnetwork 56 can be implemented by two switches in series in FIG. 4. The NMOS transistors M14, M15 of the switch S3 can have their gates connected together and to a delayed version of the logical inverse of the switching signal VSW(3), which is discussed in more detail further below. Alternatively, the NMOS transistors M14, M15 of the switch S3 can have their gates connected together and to the logical inverse of the switching signal VSW(1).

In a similar fashion, the switch S2 of the switch subnetwork 60 can include a plurality of transistor pairs, including a transistor pair having an NMOS transistor M1 and a PMOS transistor M0, and another transistor pair having an NMOS transistors M3 and a PMOS transistor M2. Each of these transistor pairs can operate as a separate switch, and thus the switch S2 of the switch subnetwork 60 can be implemented by two switches in series in FIG. 4. The NMOS transistors M1, M3 of the transistor pairs can have their gates connected together and to the switching signal VSW(0), and the PMOS transistors M0, M2 of the transistor pairs can have their gates connected together and to the logical inverse of the switching signal VSW(1). The switch S4 of the switch network 60 can include a plurality of transistors, including PMOS transistors M4 and M5. Each of these PMOS transistors M4, M5 can operate as a separate switch, and thus the switch S4 of the switch subnetwork 60 can be implemented by two switches in series in FIG. 4. The PMOS transistors M4, M5 can have their gates connected together and to the delayed version of the switching signal VSW(2), which is also discussed in more detail further below.

The switch S5 of the switch subnetwork 64 can include a transistor pair having an NMOS transistor M20 and a PMOS transistor M21. This transistor can operate as a switch. The NMOS transistor M20 of the transistor pair can have its gate connected to the logical inverse of the switching signal VSW(1), and the PMOS transistor M21 of the transistor pair can have its gates connected to the switching signal VSW(0).

In the embodiment of FIG. 4, the switch subnetworks 56 and 60 can also include further switches S6, S7, S8, S9 to increase the beneficial functionality provided by the switch network 52. The further switches S6, S7, S8, S9 can, for example, each operate to facilitate or increase the benefits provided by the operation of one or more of the switches S1, S2, S3, S4, S5 of the switch network 52. For example, the further switches can include switches S6 and S7 of the switch subnetworks 56 and 60, respectively, that can be turned on during the active or delayed active states of the switching signal VSW(0), VSW(2) to connect internal nodes of the switches S3 and S4 of these switch subnetworks 56, 60 to the third reference voltage VREF3. Connecting the internal nodes of the switches S3, S4 in this way can reduce leakage currents of transistors of these switches S3, S4 and thereby increase the effectiveness of the connection together of the sources and bodies of the pass-through transistors 44, 48 provided by the switches S1, S2 during the active state of the switching signal VSW(0). In a similar manner, the further switches can include switches S8 and S9 of the switch subnetworks 56 and 60, respectively, that can be turned on during the inactive or delayed inactive states of the switching signal VSW(0), VSW(2) to connect internal nodes of the switches S1, S2 to the third reference voltage VREF3. Connecting the internal nodes of the switches S1, S2 can reduce leakage currents of transistors of the switches S1, S2 and thereby increasing the effectiveness of the connection of the bodies of the pass-through transistors 44, 48 to the first and second reference voltages VREF1, VREF2 provided by the switches S3, S4 during the inactive state of the switching signal VSW(0).

In FIG. 4, the switch S6 of the switch subnetwork 56 can include a transistor pair having an NMOS transistor M18 and a PMOS transistor M19, with the NMOS transistor M18 having its gate connected to the delayed version of the switching signal VSW(2) and the PMOS transistor M19 having its gate connected to the logical inverse of the delayed switching signal VSW(3). This transistor pair can implement a switch S6 that can be turned on in response to the active state of the delayed switching signal VSW(2), connecting the node VE between the pair of transistors of the switch S3 to the third reference voltage VREF3 during this delayed active state. This switch S6 can then be turned off in response to the inactive state of the delayed switching signal VSW(2), disconnecting the node VE from the third reference voltage VREF2 during this delayed inactive state. Connecting the node VE between the transistors of the switch S3 to the third reference voltage VREF3 during the delayed active state can reduce any leakage current through transistor M14 during the active state of the switching signal VSW(0) by decreasing the voltage across the drain to source of this transistor M14 as the third reference voltage VREF3 can be selected to be similar to the input voltage VIN, as this input voltage VIN effectively appears at the source of this transistor M14 due to the connection of the sources to the bodies of the NMOS pass-through transistors 44 and the effective connection of the input voltage VIN to these connected sources and bodies due to the on state of the NMOS pass-through transistors 44. The decreased leakage current of transistor M14 can in turn increase the effectiveness of and benefits provided by the connection together of the sources and bodies of the NMOS pass-through transistors by the switch S1.

Similarly, in FIG. 4, the switch S7 of the second switch subnetwork 60 can include a transistor pair having an NMOS transistor M8 and a PMOS transistor M9, with the NMOS transistor M8 having its gate connected to the delayed version of the switching signal VSW(2) and the PMOS transistor M9 having its gate connected to the logical inverse of the delayed switching signal VSW(3). This transistor pair can implement a switch S7 that can be turned on in response to the active state of the delayed switching signal VSW(2), connecting the node VC between the pair of transistors of the switch S4 to the third reference voltage VREF3 during this delayed active state. This switch S7 can then be turned off in response to the inactive state of the delayed switching signal VSW(2), disconnecting the node VC from the third reference voltage VREF3 during the delayed inactive state. Similar to the operation of the switch S6, connecting the node VC between the transistors of the switch S4 to the third reference voltage VREF3 during the delayed active state can reduce any leakage current through transistor M4 during the active state of the switching signal VSW(0) by decreasing the voltage across the drain to source of this transistor M14 as the third reference voltage VREF3 can be selected to be similar to the input voltage VIN, thereby increasing the effectiveness of and benefits provided by the connection together of the sources and bodies of the PMOS pass-through transistors 48 by the switch S2.

In FIG. 4, the switch subnetwork 56 can include a switch S8 having a transistor pair including an NMOS transistor M16 and a PMOS transistor M17, with the NMOS transistor M16 having its gate connected to the logical inverse of the switching signal VSW(1) and the PMOS transistor M17 having its gate connected to the switching signal VSW(0). This transistor pair can implement a switch S8 that can be turned off in response to the active state of the switching signal VSW(0), preventing the node VD between the pairs of complimentary transistors of the switch S1 from being connected to the third reference voltage VREF3 during the active state of the switching signal VSW(0), and turned on in response to the inactive state of the switching signal VSW(0), connecting the node VD to the third reference voltage VREF3 during this inactive state. Connecting the node VD between the transistor pairs of the switch S1 to the third reference voltage VREF3 during the inactive state reduces any leakage current through transistor pair M10, M11 during the inactive state of the switching signal VSW(0) by decreasing the voltage across the drains to sources of the transistors M10, M11 as the third reference voltage VREF3 effectively appears at both the drains and sources of these transistors M10, M11 through the action of the switch S5 and the connection of the third reference voltage VREF3 to node VD. Reducing the leakage current through transistors M10, M11 during the inactive state of the switching signal VSW(0) in turn increases the effectiveness of and the benefits provided by connecting the third reference voltage VREF3 to the sources of the NMOS pass-through transistors 44 by the switch S5.

Similarly, in FIG. 4, the switch subnetwork 60 can include a switch S9 having a transistor pair including an NMOS transistor M6 and a PMOS transistor M7, with the NMOS transistor M6 having its gate connected to the logical inverse of the switching signal VSW(1) and the PMOS transistor M7 having its gate connected to the switching signal VSW(0). This transistor pair can implement a switch S9 that can be turned off in response to the active state of the switching signal VSW(0), preventing the node VB between the pairs of complimentary transistors of the second switch S2 from being connected to the third reference voltage VREF3 during the active state of the switching signal VSW(0), and turned on in response to the inactive state of the switching signal VSW(0), connecting the node VB to the third reference voltage VREF3 during this inactive state. Similar to the operation of the switch S8, connecting the node VB between the transistor pairs of the switch S2 to the third reference voltage VREF3 during the inactive state of the switching signal VSW(0) reduces any leakage current through the transistor pair M0, M1 during the inactive state by decreasing the voltage across the drains to sources of the transistors M0, M1, as the third reference voltage VREF3 effectively appears at both the drains and sources of these transistors M0, M1 through the action of the switch S5 and the connection of the third reference VREF3 voltage to node VB. Reducing the leakage current through transistors M0, M1 during the inactive state of the switching signal VSW(0) in turn increases the effectiveness of and the benefits provided by connecting the third reference voltage VREF3 to the sources of the PMOS pass-through transistors 48 by the switch S5.

Figure 7:
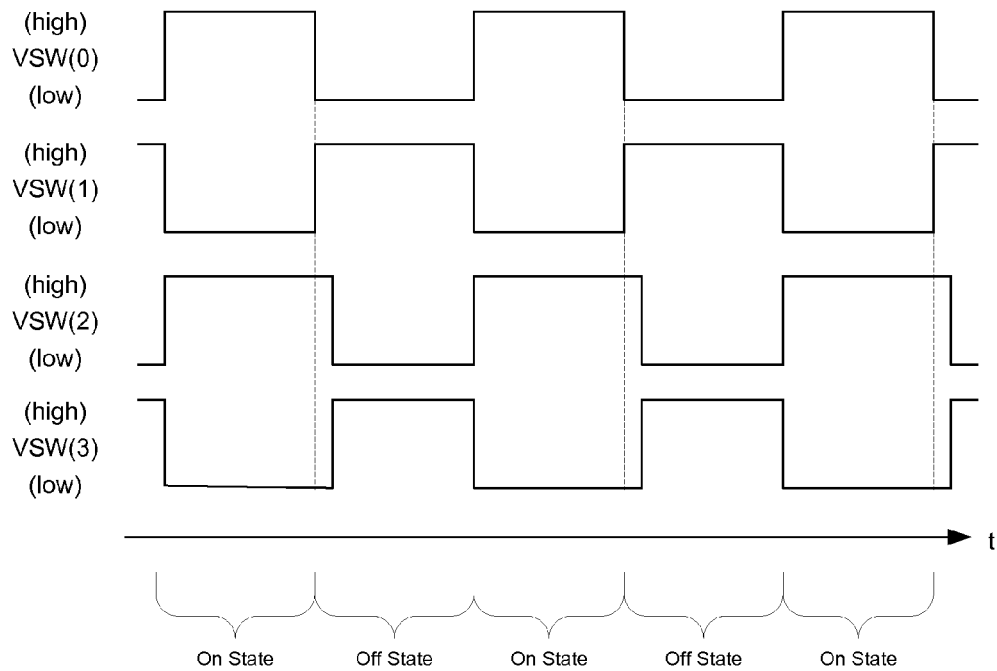
FIG. 7 is a diagram depicting an embodiment of control signals for controlling the switch circuit.

FIG. 7 depicts an embodiment of switching signals VSW that can be used to control operation of the switch circuit 40 in on and off states, including switching on and off of the NMOS and PMOS pass-through transistors 44, 48 as well as the controlling the various switches of the switch network 52 and its subnetworks 56, 60, 64 in correspondence to the on and off states of the switch circuit 40. (Note that, as used and depicted herein, VSW can be a collective reference to all of the switching signals VSW, including the switching signal VSW(0), its logical inverse VSW(1), the delayed switching signal VSW(2), and its logical inverse VSW(3)). In FIG. 7, the main switching signal VSW(0) and its logical inverse VSW(1) can control switching on and off of the NMOS and PMOS pass-through transistors 44, 48, respectively. When the main switching signal VSW(0) is active, e.g., having a logical high state, the logical inverse of the main switching signal VSW(1) can have a logical low state, and the NMOS and PMOS pass-through transistors 44, 48 can be active, i.e., turned on, to allow the input signal VIN at the input terminal to pass through to produce the output signal VOUT at the output terminal. When the main switching signal VSW(0) is inactive, e.g., having a logical low state, the logical inverse of the main switching signal VSW(1) can have a logical high state, and the NMOS and PMOS pass-through devices 44, 48 can be inactive, i.e., turned off, to prevent the input signal VIN at the input terminal from passing through to the output terminal. As discussed above, this main switching signal VSW(0) and its logical inverse VSW(1) can also control the switches S1, S2, S5, S8 and S9 of the switch subnetworks 56, 60 and 64. Therefore, these switches S1, S2, S5, S8, S9 can switch between active and inactive states (i.e., between on and off states), or between inactive and active states, at the same time that the NMOS and PMOS pass-through transistors 44, 48 switch between active and inactive states. That is, the switches S1, S2 can connect the sources to the bodies of the NMOS and PMOS pass-through transistors 44, 48 at the same time as the activation of the pass-through transistors 44, 48, and disconnect the sources from the bodies at the same time as the deactivation of the pass-through transistors 44, 48. Likewise, the switch S5 can disconnect the sources of the NMOS and PMOS pass-through transistors 44, 48 from the third reference voltage VREF3, and the switches S8, S9 can disconnect the internal nodes of the switches S1, S2 from the third reference voltage VREF3, at the same time as the activation of the NMOS and PMOS pass-through transistors 44, 48, and perform the inverse operations at the same time as the deactivation of the NMOS and PMOS pass-through transistors 44, 48.

As shown in FIGS. 4 and 7, a delayed version of the main switching signal VSW(2), and its logical inverse VSW(3), can control switching of the switches S3, S4, S6, S7 of the switch subnetworks 56, 60. The delayed version of the main switching signal VSW(2) can have a delayed transition from active to inactive states in comparison to the main switching signal VSW(0). Similarly, the logical inverse of the delayed version of the switching signal VSW(3) can have a delayed transition from a logical low state to a logical high state in comparison to the logical inverse of the main switching signal VSW(1). Thus, the connection of the bodies of the NMOS and PMOS pass-through transistors 44, 48 to the first and second reference voltages VREF1, VREF2 during the off state of the NMOS and PMOS pass-through transistors 44, 48 can be delayed by a selectable time period in comparison to the disconnection of the sources from the bodies of the NMOS and PMOS pass-through transistors 44, 48 by the main switching signal VSW(0) and its logical inverse VSW(1). This can allow for a reduction in glitches and undesired charge sharing that may occur if the disconnection of the sources from the bodies and the connection of the bodies to the first and second reference voltages VREF1, VREF2 happened at exactly the same time. In a related fashion, the disconnection of the internal nodes of the switches S3, S4 from the third reference voltage VREF3 can also be timed according to the delayed version of the main switching signal VSW(2) and its logical inverse VSW(3).

Embodiments of the switch circuit 40 can be used to implement any switch in any circuit, including to implement any switch in any circuit for which it may be desirable for the implemented switch to have low, signal-independent on-resistance in the on state and low leakage current in the off state.

Returning to FIG. 1, the differential capacitance-to-voltage converter 20 may convert the capacitance value of the sensing capacitor CS to a differential output voltage VOP-VON. The sensing capacitor CS can be part of a sensor that changes the capacitance of the sensing capacitor as a result of an environmental condition such as pressure, temperature, acceleration, Coriolis force, etc. The embodiment of FIG. 1 may be useful in situations in which the sensing capacitor has only one terminal available to interface with a capacitance-to-voltage converter circuit. The capacitance-to-voltage converter 20 can include four switches 24, 28, 32, 36, an integrator including a differential amplifier A1 and a pair of integrating feedback capacitors CI1, CI2, and the sensing capacitor CS. The sensing capacitor CS can be connected at one end to ground and at the other end to a circuit node 26. Switches 24 and 28 can be connected at one end to two reference voltages VX and VZ, respectively, and at the other end to circuit node 26. The other two switches 32 and 36 can be connected between node 26 and summing nodes 34 and 38, respectively, of the integrator. Integrating capacitors CI1 and CI2 can typically be equal in magnitude.

The capacitance-to-voltage converter 20 can operate on a four phase cycle. In phase one, switch 24 can be closed and the other switches 28, 32, 38 open, and sensing capacitor CS charged to reference voltage VX. In phase two, switch 32 can be closed and the other switches 24, 28, 36 open, connecting capacitor CS to summing node 34 and delivering charge to the first integrating capacitor CI1. In phase three, switch 28 can be closed and the other switches 24, 32, 36 open, charging sensing capacitor CS to reference voltage VZ. In phase four, switch 36 can be closed while the other switches 24, 32, 28 can be open, connecting capacitor CS to summing node 38 and exchanging charge with integrating capacitor C12. At the end of the four phases, the total charge transferred to the integrator can be equal to (VX-VZ)*CS, and the output VOP-VON can be a function of, and provide a measurement of, the magnitude of the capacitance of the sensing capacitor CS. In some embodiments, reference voltages VX, VZ may be substantially constant voltages, and in other embodiments, may be timewise varying signals, such as oscillating signals or other signals having time dependent voltage magnitudes.

Figure 1:
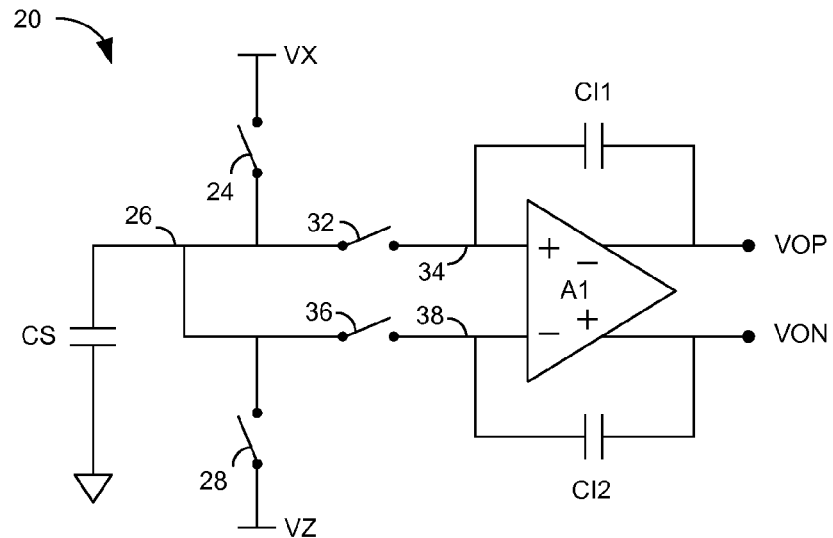
FIG. 1 is a circuit schematic depicting an embodiment of a capacitance-to-voltage converter having a plurality of switches.

Embodiments of the capacitance-to-voltage converter 20 of FIG. 1 can be implemented having one or more of the four switches 24, 28, 32, 36 implemented by embodiments of the switch circuit 40. For example, in one embodiment, the capacitance-to-voltage converter 20 of FIG. 1 can be implemented having all of the switches 24, 28, 32, 36 implemented by embodiments of the switch circuit 40. In another embodiment, the capacitance-to-voltage converter 20 of FIG. 1 can be implemented having only the two switches 32, 36 feeding the differential amplifier A1 of the integrator implemented by embodiments of the switch circuit 40, due to the potentially greater impact on circuit performance of these switches 32, 36.

Although the capacitance-to-voltage converter 20 of FIG. 1 provides a differential output VOP-VON, in other embodiments, the capacitor-to-voltage converter 20 can provide a single-ended output by, e.g., omitting switches 28 and 36 and second integrating capacitor C12, and having amplifier A1 instead be a differential-input, single-ended output amplifier with its positive input terminal connected as shown in FIG. 1, its negative input terminal connected to a third reference voltage, and its single output terminal connected as shown for the positive output terminal VOP in FIG. 1. In single-ended embodiments of the capacitance-to-voltage converter 20, the capacitance-to-voltage converter 20 can be implemented having all of the switches 24 and 32 implemented by embodiments of the switch circuit 40, or, in another embodiment, having only switch 32 implemented by embodiments of the switch circuit 40.

Figure 8:
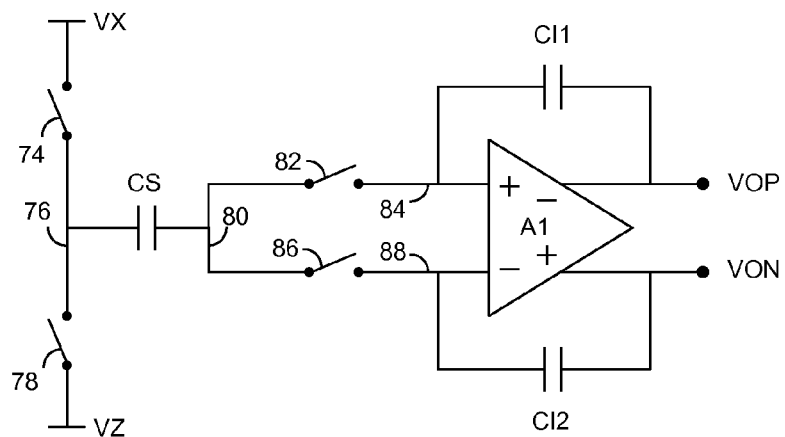
FIG. 8 is a circuit schematic depicting another embodiment of a capacitance-to-voltage converter having a plurality of switches.

FIG. 8 depicts another embodiment of a differential capacitance-to-voltage converter 70. The embodiment of FIG. 8 may be useful in situations in which the sensing capacitor has both terminals available to interface with the converter circuit. The capacitance-to-voltage converter 70 can include four switches 74, 78, 82, 86, the integrator including the differential amplifier A1 and the pair of integrating feedback capacitors CI1, CI2, and the sensing capacitor CS. The sensing capacitor CS can be connected at one end to circuit node 76 and at the other end to circuit node 80. Switches 74 and 78 can be connected at one end to the two reference voltages VX and VZ, respectively, and at the other end to circuit node 76. The other two switches 82 and 86 can be connected between node 80 and summing nodes 84 and 88, respectively, of the integrator. Integrating capacitors CI1 and CI2 can typically be equal in magnitude. The capacitance-to-voltage converter 70 can operate on a two phase cycle. In phase one, switches 74, 82 can be closed and the other switches 78, 86 open. In phase two, switches 78, 86 can be closed and the other switches 74, 82 open. At the end of the two phases, the output VOP-VON can be a function of, and provide a measurement of, the magnitude of the capacitance of the sensing capacitor CS. Again, in some embodiments, reference voltages VX, VZ may be substantially constant voltages, and in other embodiments, may be timewise varying signals, such as oscillating signals or other signals having time dependent voltage magnitudes.

Embodiments of the capacitance-to-voltage converter 70 of FIG. 8 can be implemented having one or more of the four switches 74, 78, 82, 86 implemented by embodiments of the switch circuit 40. For example, in one embodiment, the capacitance-to-voltage converter 70 of FIG. 1 can be implemented having all of the switches 74, 78, 82, 86 implemented by embodiments of the switch circuit 40. In another embodiment, the capacitance-to-voltage converter 70 of FIG. 8 can be implemented having only the two switches 82, 86 feeding the differential amplifier A1 of the integrator implemented by embodiments of the switch circuit 40, due to the potentially greater impact on circuit performance of these switches 82, 86.

Although the capacitance-to-voltage converter 70 of FIG. 8 provides a differential output VOP-VON, in other embodiments, the capacitance-to-voltage converter 70 can provide a single-ended output by, e.g., omitting switches 78 and 86 and second integrating capacitor C12, and having amplifier A1 instead be a differential-input, single-ended output amplifier with its positive input terminal connected as shown in FIG. 8, its negative input terminal connected to a third reference voltage, and its single output terminal connected as shown for the positive output terminal VOP in FIG. 8. In single-ended embodiments of the capacitance-to-voltage converter 70, the capacitance-to-voltage converter 20 can be implemented having all of the switches 74 and 82 implemented by embodiments of the switch circuit 40, or, in another embodiment, having only switch 82 implemented by embodiments of the switch circuit 40.

Switches of other circuits, e.g., integrators, discrete time signal processing circuits, filters, etc., can also include one or more switches implemented by embodiments of the switch circuit 40.

Other embodiments of the switch circuit 40 are possible. Although FIG. 4 shows a specific embodiment in which the NMOS pass-through transistors 44 include a pair of NMOS pass-through transistors 44 and a pair of PMOS pass-through transistors 48, the NMOS pass through transistors can more generally include one or more NMOS pass-through transistors 44 and the PMOS pass through transistors can include one or more PMOS pass-through transistors 48. For example, the NMOS pass through transistors 44 can include more than two NMOS pass-through transistors 44 connected in series and the PMOS pass through transistors 48 can include more than two PMOS pass-through transistors 48 connected in series. The NMOS pass through transistors 44 can also include a plurality of NMOS pass-through transistors 44 connected in parallel and the PMOS pass through transistors 48 can include a plurality of PMOS pass-through transistors 48 connected in parallel. Additionally, the NMOS pass through transistors 44 can also include a plurality of NMOS pass-through transistors 44 connected in series and a plurality of NMOS pass-through transistors 44 connected in parallel (which can optionally partially overlap with the plurality of NMOS pass-through transistors 44 connected in series), and the PMOS pass through transistors 48 can include a plurality of PMOS pass-through transistors 48 connected in series and a plurality of PMOS pass-through transistors 48 connected in parallel (which can optionally overlap with the plurality of PMOS pass-through transistors 48 connected in series). In embodiments having a different number of NMOS or PMOS pass-through transistors 44, 48, or series or parallel connections therefore, than shown in FIG. 4, one, some or all of such NMOS and PMOS pass-through transistors 44, 48 can have their bodies and sources selectively connected as in FIGS. 2-4.

Although FIGS. 2-7 show the main switching signal VSW(0), along with its logical inverse VSW(1), controlling various of the switches of the switch network 52 and its switch subnetworks 56, 60, 64, and the delayed switching signal VSW(2), along with its logical inverse VSW(3), controlling various others of the switches of the switch network 52 and the switch subnetworks 56, 60, 64, in other embodiments the main switching signal VSW(0), along with its logical inverse VSW(1), can be used to control all of the switches of the switch network 52 and its switch subnetworks 56, 60, 62, with the main switching signal VSW(0) substituted for the delayed switching signal VSW(2), and the logical inverse of the main switching signal VSW(1) substituted for the logical inverse of the delayed switching signal VSW(3), in such embodiments. The main switching signal VSW(0) and the delayed main switching signal VSW(2), and their logical inverses VSW(1), VSW(3), can also be differently allocated to controlling various ones or pluralities of the switches of the switch network 52. Also, the delayed switching signal VSW(2) can be delayed, or different positioned in time, with respect to the main switching signal VSW(0) differently than as shown in FIG. 7. For example, the delayed switching signal VSW(2), and its logical inverse VSW(3), can optionally have delayed or early rising or falling edges, or any combination thereof, in comparison to the main switching signal VSW(0) and its logical inverse VSW(1). Further, the identification of logical high or logical low as corresponding to active and inactive states, or vice versa, can be a function of the context in which such signals are discussed. In other embodiments, switches of the switch network 52 may be composed such that logical low and logical high can correspond to active and inactive states, respectively, or vice versa.

NMOS and PMOS transistors, as utilized in embodiments of the switch circuit to implement the NMOS and PMOS pass-through transistors 44, 48 and various switches of the switch network 52, may be designed or manufactured in a symmetric fashion so that the source and drain of such transistors are similar or identical in construction. Therefore, in embodiments of the switch circuit 40, identification of particular terminals as either source or drain may be reversible.

The switches S1, S2, S3, S4, S5, S6, S7, S8 and S9 of the switch network 52 can also optionally be implemented by transistor configurations other than as shown in FIG. 4.

Additional embodiments of the switch circuit 40 are also possible. For example, any feature of any of the embodiments of the switch circuit 40 described herein can optionally be used in any other embodiment of the switch circuit 40. Embodiments of the switch circuit 40 can also optionally include any subset of the components or features of any embodiments of the switch circuit 40 described herein.

What is claimed is:

1. A switch circuit, comprising:
   a pair of NMOS transistors connected in series as pass-through transistors to transmit an input signal at an input terminal to produce an output signal at output terminal in response to an active state of a switching signal;
   a pair of PMOS transistors connected in series as pass-through transistors to transmit the input signal at the input terminal to produce the output signal at output terminal in response to the active state of the switching signal; and
   a switch network connecting, in response to the active state of the switching signal, sources to bodies of the pairs of NMOS and PMOS transistors, and connecting, in response to an inactive state of the switching signal, the bodies of the pair of NMOS transistors to a first reference voltage, the bodies of the pair of PMOS transistors to a second reference voltage, and the sources of the pairs of NMOS and PMOS transistors to a third reference voltage.

2. The switch circuit of claim 1, wherein the sources of the pair of NMOS transistors are connected to the sources of the pair of PMOS transistors.

3. The switch circuit of claim 1, wherein the bodies of the pair of NMOS transistors are connected together, and the bodes of the pair of PMOS transistors are connected together.

4. The switch circuit of claim 1, wherein the first reference voltage is a lower supply voltage, the second reference voltage is an upper supply voltage, and the third reference voltage is an intermediate voltage between the lower and upper supply voltages.

5. The switch circuit of claim 1, wherein the third reference voltage is an intermediate voltage about halfway between the lower and upper supply voltages.

6. The switch circuit of claim 1, wherein the third reference voltage is an intermediate voltage having a value at a selectable point between the lower and upper supply voltages.

7. The switch circuit of claim 1, wherein the switch network includes a first switch connecting the sources to the bodies of the pair of NMOS transistors, and a second switch connecting the sources to the bodies of the pair of PMOS transistors, in response to the active state of the switching signal.

8. The switch circuit of claim 7, wherein the first and second switches each include first and second pairs of complimentary transistors, wherein the pairs of transistors each act as a switch and are connected in series with each other.

9. The switch circuit of claim 7, wherein the fifth switch includes a pair of complimentary transistors acting as a switch.

10. The switch circuit of claim 7, wherein the switch network includes an eighth switch to connect an internal node of the first switch to a third reference voltage, and a ninth switch to connect an internal node of the second switch to the third reference voltage, in response to a delayed version of the inactive state of the switching signal.

11. The switch circuit of claim 10, wherein the eighth and ninth switches each include a pair of complimentary transistors acting as a switch.

12. The switch circuit of claim 1, wherein the switch network includes a third switch connecting the bodies of the pair of NMOS transistors to the first reference voltage, and a fourth switch connecting the bodies of the pair of PMOS transistors to the second reference voltage, in response to the inactive state of the switching signal.

13. The switch circuit of claim 12, wherein the third and fourth switches each include first and second transistors, wherein the transistors each act as a switch and are connected in series with each other.

14. The switch circuit of claim 12, wherein the switch network includes a sixth switch to connect an internal node of the third switch to a third reference voltage, and a seventh switch to connect an internal node of the fourth switch to the third reference voltage, in response to a delayed version of the inactive state of the switching signal.

15. The switch circuit of claim 14, wherein the sixth and seventh switches each include a pair of complimentary transistors acting as a switch.

16. The switch circuit of claim 1, wherein the switch network includes a fifth switch connecting the sources of the pairs of NMOS and PMOS transistors to the third reference voltage in response to the inactive state of the switching signal.

17. The switch circuit of claim 1, wherein the drains of one of the pair of NMOS transistors and one of the pair of PMOS transistors are connected to the input terminal, and drains of the other of the pair of NMOS transistors and the other of the pair of PMOS transistors are connected to the output terminal.

18. A switch circuit, comprising:
a plurality of NMOS transistors connected in series as pass-through transistors to transmit an input signal at an input terminal to produce an output signal at output terminal in response to an active state of a switching signal;
a plurality of PMOS transistors connected in series as pass-through transistors to transmit the input signal at the input terminal to produce the output signal at output terminal in response to the active state of the switching signal; and
a switch network connecting, in response to the active state of the switching signal, sources to bodies of the NMOS and PMOS transistors, and connecting, in response to an inactive state of the switching signal, the bodies of the NMOS transistors to a first reference voltage, the bodies of the PMOS transistors to a second reference voltage, and the sources of the NMOS and PMOS transistors to a third reference voltage.

19. The switch circuit of claim 18, wherein the first reference voltage is a lower supply voltage, the second reference voltage is an upper supply voltage, and the third reference voltage is an intermediate voltage between the lower and upper supply voltages.

20. The switch circuit of claim 18, wherein the switch network includes a first switch connecting the sources to the bodies of the plurality of NMOS transistors, and a second switch connecting the sources to the bodies of the plurality of PMOS transistors, in response to the active state of the switching signal.

21. The switch circuit of claim 20, wherein the switch network includes an eighth switch to connect an internal node of the first switch to a third reference voltage, and a ninth switch to connect an internal node of the second switch to the third reference voltage, in response to a delayed version of the inactive state of the switching signal.

22. The switch circuit of claim 18, wherein the switch network includes a third switch connecting the bodies of the plurality of NMOS transistors to the first reference voltage, and a fourth switch connecting the bodies of the plurality of PMOS transistors to the second reference voltage, in response to the inactive state of the switching signal.

23. The switch circuit of claim 22, wherein the switch network includes a sixth switch to connect an internal node of the third switch to a third reference voltage, and a seventh switch to connect an internal node of the fourth switch to the third reference voltage, in response to a delayed version of the inactive state of the switching signal.

24. The switch circuit of claim 18, wherein the switch network includes a fifth switch connecting the sources of the plurality of NMOS and PMOS transistors to the third reference voltage in response to the inactive state of the switching signal.

25. A capacitance-to-voltage converter, comprising:
a sensing capacitor connected to at least one switch circuit;
an amplifier having an input connected to the at least one switch circuit;
at least one integrating capacitor connected between the input and an output of the amplifier;
the switch circuit, including:
a pair of NMOS transistors connected in series as pass-through transistors to transmit an input signal at an input terminal to produce an output signal at output terminal in response to an active state of a switching signal;
a pair of PMOS transistors connected in series as pass-through transistors to transmit the input signal at the input terminal to produce the output signal at output terminal in response to the active state of the switching signal; and a switch network connecting, in response to the active state of the switching signal, sources to bodies of the pairs of NMOS and PMOS transistors, and connecting, in response to an inactive state of the switching signal, the bodies of the pair of NMOS transistors to a first reference voltage, the bodies of the pair of PMOS transistors to a second reference voltage, and the sources of the pairs of NMOS and PMOS transistors to a third reference voltage.

26. The capacitance-to-voltage converter of claim 25, wherein the amplifier is a differential-input, differential-output amplifier, the at least one switch circuit includes a pair of the switch circuits, each connected between a respective one of differential inputs of the amplifier and the sensing capacitor, and the at least one integrating capacitor includes a pair of the integrating capacitors, each connected between respective ones of differential outputs of the amplifier and ones of the differential inputs of the amplifier.

27. The capacitance-to-voltage converter of claim 26, wherein the at least one switch circuit includes a second pair of the switch circuits, each connected to the sensing capacitor and a respective one of two reference voltages.

28. The capacitance-to-voltage converter of claim 25, wherein the first reference voltage is a lower supply voltage, the second reference voltage is an upper supply voltage, and the third reference voltage is an intermediate voltage between the lower and upper supply voltages.

29. The capacitance-to-voltage converter of claim 25, wherein the switch network includes a first switch connecting the sources to the bodies of the pair of NMOS transistors, and a second switch connecting the sources to the bodies of the pair of PMOS transistors, in response to the active state of the switching signal.

30. The capacitance-to-voltage converter of claim 29, wherein the switch network includes an eighth switch to connect an internal node of the first switch to a third reference voltage, and a ninth switch to connect an internal node of the second switch to the third reference voltage, in response to a delayed version of the inactive state of the switching signal.

31. The capacitance-to-voltage converter of claim 25, wherein the switch network includes a third switch connecting the bodies of the pair of NMOS transistors to the first reference voltage, and a fourth switch connecting the bodies of the pair of PMOS transistors to the second reference voltage, in response to the inactive state of the switching signal.

32. The capacitance-to-voltage converter of claim 31, wherein the switch network includes a sixth switch to connect an internal node of the third switch to a third reference voltage, and a seventh switch to connect an internal node of the fourth switch to the third reference voltage, in response to a delayed version of the inactive state of the switching signal.

33. The capacitance-to-voltage converter of claim 25, wherein the switch network includes a fifth switch connecting the sources of the pairs of NMOS and PMOS transistors to the third reference voltage in response to the inactive state of the switching signal.

\* \* \* \* \*